US011988698B2

(12) United States Patent
Teboulle et al.

(10) Patent No.: US 11,988,698 B2
(45) Date of Patent: May 21, 2024

(54) VERIFYING THE ACCURACY OF MEASUREMENTS TAKEN BY AN ELECTRICITY METER

(71) Applicant: SAGEMCOM ENERGY & TELECOM SAS, Rueil Malmaison (FR)

(72) Inventors: Henri Teboulle, Rueil Malmaison (FR); Christophe Grincourt, Rueil Malmaison (FR)

(73) Assignee: SAGEMCOM ENERGY & TELECOM SAS, Rueil Malmaison (FR)

( * ) Notice: Subject to any disclaimer, the term of this patent is extended or adjusted under 35 U.S.C. 154(b) by 221 days.

(21) Appl. No.: 17/391,906

(22) Filed: Aug. 2, 2021

(65) Prior Publication Data
US 2022/0065907 A1 Mar. 3, 2022

(30) Foreign Application Priority Data
Aug. 27, 2020 (FR) ...................................... 20 08760

(51) Int. Cl.
*G01R 22/06* (2006.01)
(52) U.S. Cl.
CPC .................................. *G01R 22/068* (2013.01)
(58) Field of Classification Search
CPC ...... G01R 22/068; G01R 22/10; G01R 35/04; G01R 35/02; G01R 22/061
USPC ........................................ 324/74, 73.1, 76.11
See application file for complete search history.

(56) References Cited

U.S. PATENT DOCUMENTS

| | | | |
|---|---|---|---|
| 11,402,457 B2 * | 8/2022 | Li ........................ | G01R 31/3272 |
| 2020/0256903 A1 * | 8/2020 | Joshi ..................... | G01R 35/04 |
| 2021/0190838 A1 * | 6/2021 | Stenberg ............... | G01R 22/068 |
| 2022/0349927 A1 * | 11/2022 | Ranta .................... | G01R 22/066 |
| 2023/0116311 A1 * | 4/2023 | Gunn .................... | G01R 22/061 |
| | | | 324/74 |
| 2024/0029178 A1 * | 1/2024 | Lin ....................... | G06Q 50/06 |

FOREIGN PATENT DOCUMENTS

| | | |
|---|---|---|
| EP | 2343561 A1 | 7/2011 |
| EP | 3026447 A1 | 6/2016 |

* cited by examiner

*Primary Examiner* — Giovanni Astacio-Oquendo
(74) *Attorney, Agent, or Firm* — MUNCY, GEISSLER, OLDS & LOWE, P.C.

(57) ABSTRACT

A method of evaluating the accuracy of an electricity meter, the method comprising: a preliminary stage comprising a step of acquiring first measurements of a first electrical magnitude, and a step of detecting a period of stability; a test stage comprising a step of injecting a test current into a conductor of the electricity meter, and a step of acquiring at least one second measurement of the first electrical magnitude; an evaluation stage comprising a step of comparing the second measurement of the first electrical magnitude with the sum of a first stability value representative of the first electrical magnitude during the period of stability plus a predefined value corresponding to the expected increase in the first electrical magnitude due to injecting the test current, and a step of evaluating the accuracy of the meter from said comparison.

19 Claims, 1 Drawing Sheet

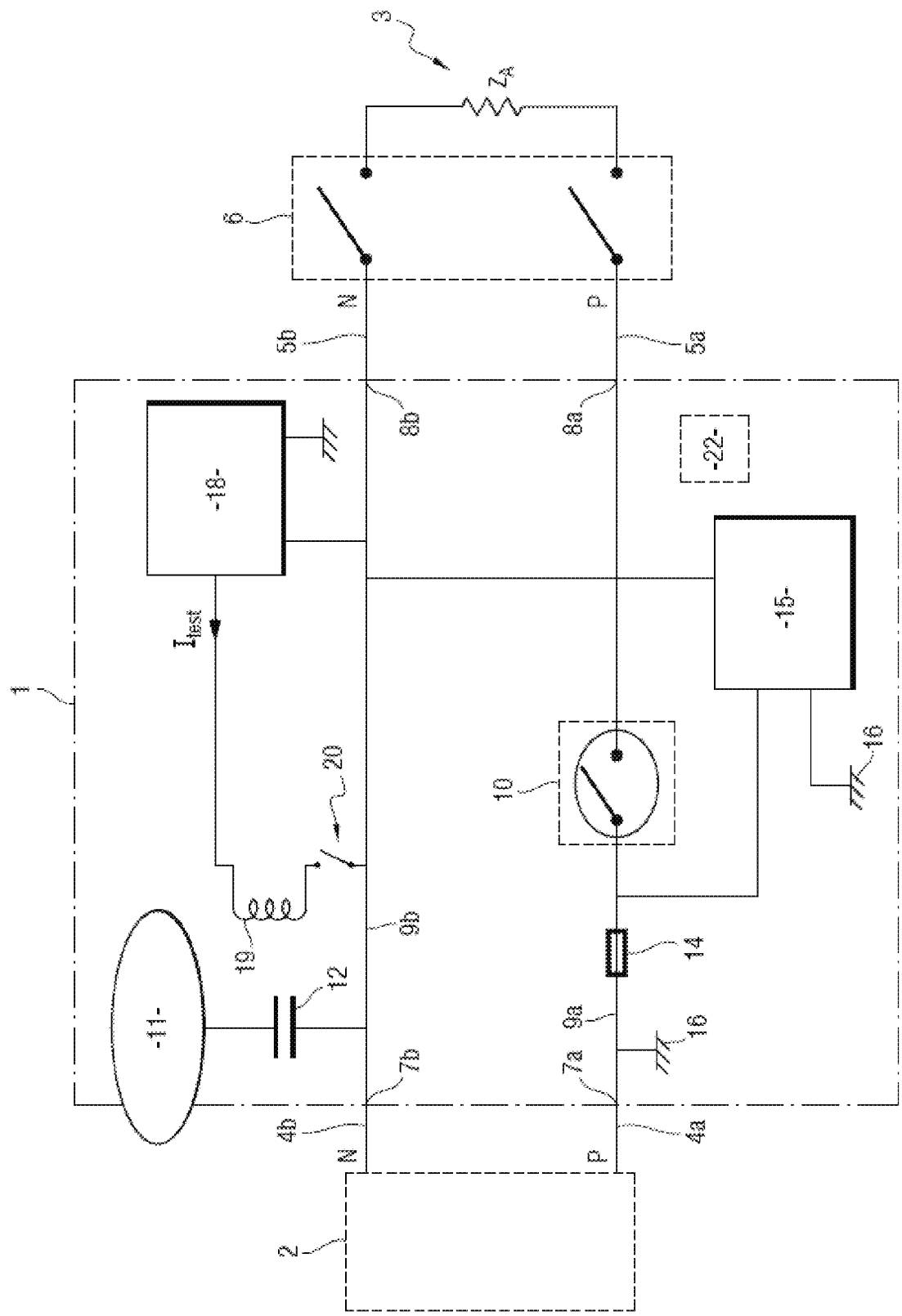

VERIFYING THE ACCURACY OF MEASUREMENTS TAKEN BY AN ELECTRICITY METER

The invention relates to the field of smart electricity meters.

BACKGROUND OF THE INVENTION

A modern electricity meter, also referred to as a "smart" electricity meter, has as its main function measuring the electrical energy that is consumed by a customer's electrical installation; however it is also capable of performing various additional functions: receiving instructions to manage tariffs, remote meter reading and programming, customer information, etc.

In order to measure energy consumption, the meter includes a measurement device that, in very conventional manner, comprises one or more current sensors and one or more voltage sensors.

Naturally, it is essential for the accuracy of the measurement device in the meter to continue over time to comply with the accuracy requirements defined in the functional specifications on the basis of which said measurement device was designed. Specifically, drift in the measurement device can lead either to consumption being overestimated, which is disadvantageous for the customer, or else to consumption being underestimated, which is disadvantageous for the supplier of electrical energy.

However, sensors tend to drift over time, and it is relatively complicated to evaluate reliably how the accuracy of the measurement device of an electricity meter varies. It is naturally possible for an operator to take action on the electrical installation in order to verify measurement accuracy, however that is not desirable since such action is expensive and also runs the risk of inconveniencing the customer.

OBJECT OF THE INVENTION

An object of the invention is to evaluate, in accurate and reliable manner, the accuracy of the measurements taken by the measurement device of an electricity meter, but without requiring action by an operator.

SUMMARY OF THE INVENTION

In order to achieve this object, there is provided an evaluation method for evaluating the accuracy of a measurement device of an electricity meter, the evaluation method being performed by and in the electricity meter and comprising:
  a preliminary stage comprising a step of acquiring first measurements of a first electrical magnitude, and a step of detecting a period of stability during which the first electrical magnitude is stable;
  a test stage following detection of a period of stability and comprising an injection step for injecting a test current into a conductor of the electricity meter for a predetermined duration, and a step of acting during the injection step to acquire at least one second measurement of the first electrical magnitude;
  an evaluation stage comprising a step of comparing the second measurement of the first electrical magnitude with the sum of a first stability value representative of the first electrical magnitude during the period of stability plus a predefined value corresponding to the expected increase in the first electrical magnitude due to injecting the test current, and a step of evaluating the accuracy of the measurement device from said comparison.

The evaluation method of the invention is performed by and in the electricity meter itself, and thus makes it possible to verify the accuracy of the measurement device of the electricity meter in a manner that is automatic, without requiring human intervention on the electricity meter.

The known characteristics of the test current, which is injected into the (neutral or phase) conductor of the electricity meter after detecting a period of stability in the first electrical magnitude, make it possible to define the increase in the first electrical magnitude that is to be expected and that is measured by the measurement device. This expected increase constitutes a reference that enables the accuracy of the measurement device to be evaluated and verified in a manner that is accurate and reliable.

There is also provided an evaluation method as described above, wherein the predefined value is evaluated on the basis of the predetermined duration and on the basis of the amplitude and of the frequency of the test current.

There is also provided an evaluation method as described above, wherein a period of stability is detected when at least one first stability condition is satisfied, namely that a predetermined number of successive first measurements of the first electrical magnitude are substantially equal.

There is also provided an evaluation method as described above, further comprising a verification stage for verifying whether the difference, if any, between the second measurement of the first electrical magnitude and the first stability value is due solely to injecting the test current.

There is also provided an evaluation method as described above, wherein the verification stage is performed after the injection step, and comprises a step of acquiring a third measurement of the first electrical magnitude, and a step of verifying at least one first verification condition, namely that the third measurement of the first electrical magnitude is substantially equal to the first stability value.

There is also provided an evaluation method as described above, wherein the first electrical magnitude is the energy consumed during a predefined duration.

There is also provided an evaluation method as described above, wherein the preliminary stage also comprises a step of acquiring first measurements of a second electrical magnitude.

There is also provided an evaluation method as described above, wherein a period of stability is detected whenever both the first electrical magnitude and the second electrical magnitude are stable.

There is also provided an evaluation method as described above, wherein a period of stability is detected whenever both the first stability condition is satisfied and also a second stability condition is satisfied, namely that the same predetermined number of successive first measurements of the second electrical magnitude are substantially equal.

There is also provided an evaluation method as described above, wherein the verification stage also comprises a step of acquiring a second measurement of the second electrical magnitude, and a step of verifying both the first verification condition and also a second verification condition, namely that the second measurement of the second electrical magnitude is substantially equal to a second stability value representative of a value for the second electrical magnitude during a period of stability.

There is also provided an evaluation method as described above, wherein the second electrical magnitude is current.

There is also provided an evaluation method as described above, wherein the test current has a frequency defined in such a manner that said frequency lies within an operating frequency band of the measurement device while lying outside a frequency band used for powerline current communication performed by the electricity meter.

There is also provided an evaluation method as described above, wherein the test current has a peak amplitude lying in the range 800 milliamps (mA) to 1.2 amps (A), and wherein the test current has a frequency lying in the range 1.6 kilohertz (kHz) to 2.4 kHz.

There is also provided an electricity meter including a measurement device, an injection device comprising a current generator, and a processor module arranged to perform the evaluation method as described above There is also provided an electricity meter as described above, wherein the current generator is a current mirror incorporating an oscillator set to the frequency of the test current.

There is also provided an electricity meter as described above, wherein the current generator is connected to the conductor via an inductor and a switch controlled by the processor module.

There is also provided an electricity meter as described above, wherein the inductor presents inductance lying in the range 64 microhenries (μH) to 96 μH.

There is also provided a computer program including instructions for causing the above-described electricity meter to execute the steps of the above-described method.

There is also provided a computer-readable storage medium, having stored thereon the above-described computer program.

The invention can be better understood in the light of the following description of a particular, nonlimiting embodiment of the invention.

BRIEF DESCRIPTION OF THE DRAWING

Reference is made to the sole FIGURE:

The sole FIGURE shows electricity meter in which the evaluation method of the invention is performed.

DETAILED DESCRIPTION OF THE INVENTION

With reference to the sole FIGURE, the evaluation method of the invention in this example is performed by and in a single-phase electricity meter 1.

The meter 1 is used for measuring electrical energy supplied by an electricity distribution network 2 and consumed by an electrical installation 3 (represented symbolically by a load ZA). The network 2 includes an electricity line that comprises a phase (or "live") conductor 4a and a neutral conductor 4b. The voltage of the network 2 is an alternating voltage having a frequency equal to 50 hertz (Hz) and a root-mean-square (rms) voltage equal to 230 volts (V). The installation 3 receives the electrical energy via a phase conductor 5a and a neutral conductor 5b.

A circuit breaker 6 is positioned downstream from the meter 1 and upstream from the installation 3 so as to be capable of isolating the installation 3 from the network 2 should that be necessary.

In this example, the term "upstream" means on the side of the network 2, and the term "downstream" means on the side of the installation 3.

The meter 1 has an upstream phase terminal 7a, a downstream phase terminal 8a, an upstream neutral terminal 7b, and a downstream neutral terminal 8b.

The upstream phase terminal 7a is connected to the phase conductor 4a of the electricity network 2. The downstream phase terminal 8a is connected to a phase conductor 5a of the electrical installation 3. The upstream neutral terminal 7b is connected to the neutral conductor 4b of the electricity network 2. The downstream phase terminal 8b is connected to a neutral conductor 5b of the installation 3.

The meter 1 also has a phase conductor 9a that is connected to the upstream phase terminal 7a and to the downstream phase terminal 8a, and a neutral conductor 9b that is connected to the upstream neutral terminal 7b and to the downstream neutral terminal 8b.

The meter 1 also includes a cut-off member 10 connected in series with the phase conductor 9a between the upstream phase terminal 7a and the downstream phase terminal 8a. The cut-off member 10 enables action to be taken remotely to connect together or to disconnect the electrical installation 3 and the electricity network 2.

The meter 1 also includes a modem 11 that enables the meter 1 to perform communication power line carrier (PLC). In this example, the modem 11 is a PLC modem of G3 type. The meter 1 can thus communicate with the information system (IS) of the network manager (possibly via some other entity, such as a data concentrator, a gateway, another meter, etc.).

The modem 11 is connected to the neutral conductor 9b of the meter 1 via a capacitor 12.

The meter 1 also includes a measurement device. The measurement device takes measurements of the energy consumed by the installation 3, and it is thus used for performing the main function of the meter 1.

The measurement device comprises a voltage sensor (not shown), a current sensor 14, and a measurement module 15.

The voltage sensor produces measurements of the voltage between the phase conductor 9a and the neutral conductor 9b of the meter 1.

The current sensor 14 is a shunt that is connected in series with the phase conductor 9a of the meter 1 between the upstream phase terminal 7a and the cut-off member 10.

The measurement module 15 is connected to the phase conductor 9a of the meter 1 between the shunt and the cut-off member 10. The measurement module 15 is also connected to the neutral conductor 9b of the meter 1. The measurement module 15 is also connected to the electrical ground 16 of the meter 1. The module 15 acquires the (analog) measurements taken by the voltage sensor and by the current sensor 14, and it produces (digital) measurements of current and of the energy consumed by the installation 3.

The phase conductor 9a of the meter 1 is connected to the electrical ground 16 of the meter 1 upstream from the shunt.

The meter 1 also includes a current injection device that is arranged to inject a test current $I_{test}$ into the neutral conductor 9b of the meter 1, the test current having characteristics that are known and controlled. The injection device comprises a current generator 18, an inductor 19, and a switch 20. The inductor 19 and the switch 20 are connected in series.

As explained below, the invention consists in particular in injecting the test current $I_{test}$ into the neutral conductor 9b of the meter 1, in using the measurement device to take measurements during the injection, and in using the test current during the injection as a reference for the purpose of verifying the accuracy of the measurement device. The injection takes place into the neutral conductor 9b upstream from a point where the measurement module 15 is connected.

The current generator 18 enables the test current $I_{test}$, to be generated, which current is an alternating current (AC), specifically a sinusoidal current.

By way of example, the test current $I_{test}$ has a peak amplitude that lies in the range 800 mA to 1.2 A. In this example, the peak amplitude of the test current $I_{test}$ is equal to 1 A.

By way of example, the frequency of the test current $I_{test}$ lies in the range 1.6 kHz to 2.4 kHz. In this example, the frequency of the test current $I_{test}$ is equal to 2 kHz.

It should be observed that the value of 1 A for the peak amplitude and the value of 2 kHz for the frequency are values that can be set.

The frequency of the test current $I_{test}$ is defined to comply with (at least) two criteria.

The first criterion is that said frequency lies within the operating frequency band of the measurement device, i.e. within the frequency band in which the measurement device is capable of taking measurements with nominal accuracy.

Thus, the effects of the test current $I_{test}$ can be measured accurately using the measurement device. In this example, the measurement device has no problem in measuring the fortieth harmonic of 50 Hz, so the frequency of 2 kHz is entirely suitable.

The second criterion is that the frequency of the test current $I_{test}$ lies outside the frequency band used for PLC communication. Thus, injecting the test current $I_{test}$ does not disturb PLC communication.

By way of example, the current generator 18 is a current mirror incorporating an oscillator set to the frequency of the test current $I_{test}$, i.e. to 2 kHz in this example.

An output of the current generator 18 is connected to the neutral conductor 9b via the inductor 19 and the switch 20.

The frequency of the test current $I_{test}$ makes it possible to use an inductor 19 of inductance that is not too great.

By way of example, the inductance of the inductor 19 lies in the range 64 µH to 96 µH. In this example, the inductor has inductance equal to 80 µH.

The meter 1 also includes a processor module 22.

By way of example, the processor module 22 comprises a microcontroller, a processor, or indeed a programmable logic circuit such as a field programmable gate array (FPGA) or an application specific integrated circuit (ASIC).

The processor module 22 is connected to the measurement module 15 in order to acquire the measurements taken by the measurement device. In particular, the processor module 22 is arranged to control the switch 20 and the current generator 18 (by way of example, and where necessary, the processor module 22 may set the peak amplitude and the frequency of the test current). The processor module 22 is also connected to the modem 11.

There follows a description of the evaluation method of the invention, which method is performed by the processor module 22 of the meter 1.

At regular intervals, the accuracy of the measurement device the meter 1 is evaluated. Evaluation may be performed periodically, e.g. once a month.

The measurement device produces measurements of the current supplied to the installation and measurements of the energy consumed during a predefined duration. In this example, the predefined duration is equal to one second. Once every second, the measurement device produces a current measurement and a measurement of the energy consumed during the preceding second.

When it is appropriate to evaluate the accuracy of the measurement device, a preliminary stage is started, during which the processor module 22 acquires both first measurements of a first electrical magnitude, and also first measurements of a second electrical magnitude, as taken by the measurement device. The first electrical magnitude is the energy consumed during the predefined duration (one second), and the second electrical magnitude is current.

To simplify the description, the terms "energy measurement" and "current measurement" are used: during the preliminary stage, the processor module 22 thus acquires first energy measurements and first current measurements.

During the preliminary stage, the processor module 22 attempts to detect a period of stability, during which the energy consumed and the current are stable.

A period of stability is detected when both a first stability condition is satisfied, namely a predetermined number of successive first energy measurements are substantially equal, and also a second stability condition is satisfied, namely the same predetermined number of successive first current measurements are substantially equal.

In this example, the predetermined number is equal to two.

Thus, as soon as the processor module 22 detects two successive first energy measurements that are substantially equal, each taken at intervals of one second, and two associated first successive current measurements that are likewise substantially equal, the processor module 22 detects a stage of stability.

The term "two measurements that are substantially equal" is used to mean that the two measurements are equal to within the accuracy of the measurement device.

The processor component determines a first stability value and a second stability value. The first stability value is representative of the energy consumed during the predetermined duration in the stability period, and it is equal to the first energy measurements of the stability period. The second stability value is representative of the current during the stability period, it is equal to the first current measurements of the stability period.

After detecting a stability period, the processor module 22 begins a test stage. The processor module 22 closes the switch 20 and thus causes the current generator 18 to inject the test current $I_{test}$ for a predetermined duration into the neutral conductor 9b of the meter 1. In this example, the predetermined duration is equal to the predefined duration, i.e. to one second.

During the injection step, the processor module 22 acquires at least one second energy measurement, and specifically a single second energy measurement.

The injection step thus begins at the beginning of the third second after the beginning of the stability period and it ends at the end of the third second.

The processor module 22 then compares the second energy measurement with the first stability value in order to evaluate the accuracy of the measurement device.

Nevertheless, before performing this analysis, the processor module 22 performs a verification stage in order to verify whether the difference between the second energy measurement and the first stability value is due solely to injecting the test current (and not for example to an increase in the consumption of the installation 3).

The verification stage is performed after the injection step and consists in acquiring a third energy measurement and a second current measurement, and in verifying both a first verification condition, namely that the first energy measurement is substantially equal to the first stability value, and also a second verification condition, namely that the second current measurement is substantially equal to the second stability value.

The verification stage thus lasts for one second, and begins at the beginning of the fourth second after the beginning of the stability period.

When both verification conditions are satisfied, that means that the energy actually consumed by the installation 3 and the current have both remained constant since the beginning of the stability period, and thus that the increase in energy consumed as measured by the measurement device during the injection stage is indeed due solely to injecting the test current $I_{test}$.

When both verification conditions are satisfied, the processor module 22 compares the second energy measurement (taken during injection) with the sum of the first stability value plus a predefined value that corresponds to the increase in energy consumption during the predefined duration that is to be expected as a result of injecting the test current.

The processor module 22 evaluates the accuracy of the measurement device on the basis of said comparison: if the second energy measurement is exactly equal to the sum of the first stability value plus the predefined value, that means that the measurement device is very accurate.

The predefined value is evaluated on the basis of the predetermined duration, and on the basis of the amplitude (specifically the peak amplitude) and of the frequency of the test current $I_{test}$.

On a network having an rms voltage equal to 230 V, and for a test current with a peak amplitude of 1 A and a frequency of 2 kHz, the predefined value is equal to:

$$230/\sqrt{2}\,W\cdot s = 162.635\,W\cdot s.$$

The difference obtained between the second energy measurement and the sum of the first stability value plus the predefined value serves to evaluate and verify the accuracy of the measurement device.

The processor module 22 then uses the modem 11 and PLC communication to transmit a message to the IS, which message contains the result of verifying the accuracy of the measurement device and possibly also contains an alarm to indicate drift or any other accuracy problems. The DLMS or COSEM application layers are advantageously used to perform this communication.

It should be observed that the evaluation method is performed in a very short length of time: approximately 4 seconds suffice to evaluate and to verify the accuracy of the measurement device.

It should be observed that verification can be undertaken for all electric current situations encountered: low currents, i.e. of amplitude close to 0 A, medium currents, i.e. of amplitude equal to a few A, and strong currents, i.e. of amplitude greater than 20 A. It should also be observed that it may be appropriate to perform factory calibration of the injection of the 1 A peak and 2 kHz test current in order to adjust the measurements that are taken in normal operation.

Naturally, the invention is not limited to the embodiment described, but covers any variant coming within the ambit of the invention as defined by the claims.

The first electrical magnitude could be current and the second electrical magnitude could be energy consumed during a predefined duration.

The first electrical magnitude and the second electrical magnitude need not necessarily be energy consumed during a predefined duration and current. By way of example, one of these electrical magnitudes could be power consumed.

The evaluation method of the invention can perfectly well be performed while using measurements of only a single first electrical magnitude. In the above-described example, there is thus no need to use the current measurements, which are used mainly to consolidate detecting the period of stability and to improve the verification stage. When only a single first electrical magnitude is used:
  only the first measurements of the first electrical magnitude are acquired during the preliminary stage of the evaluation method;
  the period of stability is detected when the first stability condition (alone) is satisfied;
  only the third measurement of the first electrical magnitude is acquired during the verification stage;
  only the first verification condition is verified during the verification stage.

Although the meter described herein is a single-phase meter, the invention naturally also applies to any polyphase meter.

The processor module in which the evaluation method is performed, the measurement module, the current generator, and the modem need not necessarily be modules that are distinct, and they may have one or more components in common, which may be software components or hardware components.

The invention claimed is:

1. An evaluation method for evaluating the accuracy of a measurement device of an electricity meter, the evaluation method being performed by and in the electricity meter and comprising:
    a preliminary stage comprising a step of acquiring first measurements of a first electrical magnitude, and a step of detecting a period of stability during which the first electrical magnitude is stable;
    a test stage following detection of the period of stability and comprising an injection step for injecting a test current into a conductor of the electricity meter for a predetermined duration, and a step of acting during the injection step to acquire at least one second measurement of the first electrical magnitude;
    an evaluation stage comprising a step of comparing the second measurement of the first electrical magnitude with a sum of a first stability value representative of the first electrical magnitude during the period of stability plus a predefined value corresponding to an expected increase in the first electrical magnitude due to injecting the test current, and a step of evaluating the accuracy of the measurement device from said comparison.

2. The evaluation method according to claim 1, wherein the predefined value is evaluated on the basis of the predetermined duration and on the basis of an amplitude and of a frequency of the test current.

3. The evaluation method according to claim 1, wherein the period of stability is detected when at least one first stability condition is satisfied, namely that a predetermined number of successive first measurements of the first electrical magnitude are substantially equal.

4. The evaluation method according to claim 3,
    wherein the preliminary stage also comprises a step of acquiring first measurements of a second electrical magnitude,
    wherein the period of stability is detected whenever both the first electrical magnitude and the second electrical magnitude are stable, and
    wherein the period of stability is detected whenever both the first stability condition is satisfied and also a second stability condition is satisfied, namely that a same predetermined number of successive first measurements of the second electrical magnitude are substantially equal.

5. The evaluation method according to claim 1, further comprising a verification stage for verifying whether the difference, if any, between the second measurement of the first electrical magnitude and the first stability value is due solely to injecting the test current.

6. The evaluation method according to claim 5, wherein the verification stage is performed after the injection step, and comprises a step of acquiring a third measurement of the first electrical magnitude, and a step of verifying at least one first verification condition, namely that the third measurement of the first electrical magnitude is substantially equal to the first stability value.

7. The evaluation method according to claim 6,
wherein the preliminary stage also comprises a step of acquiring first measurements of a second electrical magnitude, and
wherein the verification stage also comprises a step of acquiring a second measurement of the second electrical magnitude, and a step of verifying both the first verification condition and also a second verification condition, namely that the second measurement of the second electrical magnitude is substantially equal to a second stability value representative of a value for the second electrical magnitude during a period of stability.

8. The evaluation method according to claim 1, wherein the first electrical magnitude is the energy consumed during a predefined duration.

9. The evaluation method according to claim 1, wherein the preliminary stage also comprises a step of acquiring first measurements of a second electrical magnitude.

10. The evaluation method according to claim 9, wherein the period of stability is detected whenever both the first electrical magnitude and the second electrical magnitude are stable.

11. The evaluation method according to claim 7, wherein the second electrical magnitude is current.

12. The evaluation method according to claim 1, wherein the test current has a frequency defined in such a manner that said frequency lies within an operating frequency band of the measurement device while lying outside a frequency band used for powerline current communication performed by the electricity meter.

13. The evaluation method according to claim 1, wherein the test current has a peak amplitude lying in the range 800 mA to 1.2 A, and wherein the test current has a frequency lying in the range 1.6 kHz to 2.4 kHz.

14. An electricity meter including a measurement device, an injection device comprising a current generator, and a processor module arranged to perform the evaluation method according to claim 1.

15. The electricity meter according to claim 14, wherein the current generator is a current mirror incorporating an oscillator set to the frequency of the test current.

16. The electricity meter according to claim 14, wherein the current generator is connected to the conductor via an inductor and a switch controlled by the processor module.

17. The electricity meter according to claim 16, wherein the inductor presents inductance lying in the range 64 µH to 96 µH.

18. A computer program stored in a non-transitory computer-readable storage medium including instructions for causing the electricity meter according to claim 14 to execute the steps of the evaluation method.

19. A non-transitory computer-readable storage medium storing the computer program according to claim 18.

\* \* \* \* \*